(12) United States Patent
Hung (10) Patent No.: US 9,521,750 B2
(45) Date of Patent: Dec. 13, 2016

(54) PRINTED CIRCUIT BOARD OF PROBE CARD

(71) Applicant: Hermes-Epitek Corp., Taipei (TW)

(72) Inventor: Chien-Yao Hung, Hsin-Chu (TW)

(73) Assignee: HERMES-EPITEK CORP., Taipei (TW)

( * ) Notice: Subject to any disclaimer, the term of this patent is extended or adjusted under 35 U.S.C. 154(b) by 0 days.

(21) Appl. No.: 14/713,424

(22) Filed: May 15, 2015

(65) Prior Publication Data

US 2015/0334835 A1 Nov. 19, 2015

(30) Foreign Application Priority Data

May 15, 2014 (TW) .............................. 103117157 A (51) Int. Cl.
*H05K 1/11* (2006.01)
*H05K 1/02* (2006.01)
*H05K 3/40* (2006.01)

(52) U.S. Cl.
CPC ............. *H05K 1/115* (2013.01); *H05K 1/0296* (2013.01); *H05K 3/4007* (2013.01); *H05K 2201/09063* (2013.01); *H05K 2201/09227* (2013.01)

(58) Field of Classification Search
CPC .................. H05K 1/115; H05K 1/0296; H05K 2201/09227; H05K 3/4007; H05K 2201/09063
USPC ................ 174/262, 250, 251, 255, 257, 261
See application file for complete search history.

(56) References Cited

U.S. PATENT DOCUMENTS

2006/0091510 A1* 5/2006 Liu ..................... G01R 31/2889
257/678

* cited by examiner

*Primary Examiner* — Tremesha S Willis
(74) *Attorney, Agent, or Firm* — Muncy, Geissler, Olds & Lowe, P.C.

(57) ABSTRACT

The present invention relates to a printed circuit board of a probe card. The printed circuit board comprises a first side, a second side, a plurality of plated through holes and at least one electric barrier. The first side includes a plurality of first contacts and a plurality of second contacts respectively corresponding to the first contacts. The second side includes a plurality of third contacts respectively corresponding to the second contacts and a plurality of second-side traces extended to a predefined/specific region. The plated through holes penetrate through the first side and the second side, so that the third contacts are electrically connected to the second contacts. The at least one electric barrier is installed among at least two of the second side traces.

8 Claims, 11 Drawing Sheets

PRINTED CIRCUIT BOARD OF PROBE CARD

BACKGROUND OF THE INVENTION

1. Field of the Invention

The present invention relates to an IC test device, particularly to a probe card structure for IC test.

2. Description of the Prior Art

In semiconductor fabrication, wafer sort is referred to a technology testing the integrated circuit (IC) on a wafer to guarantee that IC can operate normally and learn the yield of products. Normally, an automatic test equipment (ATE) is temporarily electrically connected with IC on a wafer to verify the performance of IC. A probe card is used to transmit signals between ATE and IC.

With continuous advancement of semiconductor technology, chips are persistently miniaturized to smaller and smaller size. Therefore, it is necessary to reduce the related dimensions of a probe card for wafer sort, such as the layout of the signal traces (for electric connection of the probe head) on the wafer side of the circuit board of a probe card. However, miniaturization of the signal trace layout would decrease the spacing between signal traces and may lead to leakage current therebetween. In such a case, the quality and result of wafer sort will be affected.

SUMMARY OF THE INVENTION

One objective of the present invention is to provide a printed circuit board of a probe card, which has at least one electric barrier disposed between the second-side traces on the second side of the printed circuit board to decrease the probability of leakage current.

In one embodiment, the printed circuit board of a probe card of the present invention is a substrate having a first side and a second side and comprises a plurality of first contacts, a plurality of second contacts, a plurality of third contacts, a plurality of second-side traces, a plurality of plated through holes (PTH), and at least one electric barrier. The plurality of first contacts is disposed on the first side of the substrate. The plurality of second contacts is disposed on the first side of the substrate. At least two first contacts are respectively corresponding to different second contacts. The plurality of third contacts is disposed on the second side of the substrate. The third contacts are respectively corresponding to different second contacts. The plurality of second-side traces is disposed on the second side of the substrate. Each of the second-side traces has a front end and a rear end. The front end of each second-side trace is electrically connected with one of the third contacts. The rear ends of the second-side traces are distributed in a predefined/specified area, which is located in a region encircled by a loop formed via connecting the front ends of the second-side traces. The plurality of plated through holes penetrates through the first side and the second side of the substrate to make each third contact electrically connected with the corresponding second contact. The at least electric barrier is disposed among at least two of the plurality of second-side traces.

Below, embodiments are described in detail in cooperation with the attached drawings to make easily understood the objectives, technical contents, characteristics and accomplishments of the present invention.

DESCRIPTION OF THE PREFERRED EMBODIMENT

Figure 1:
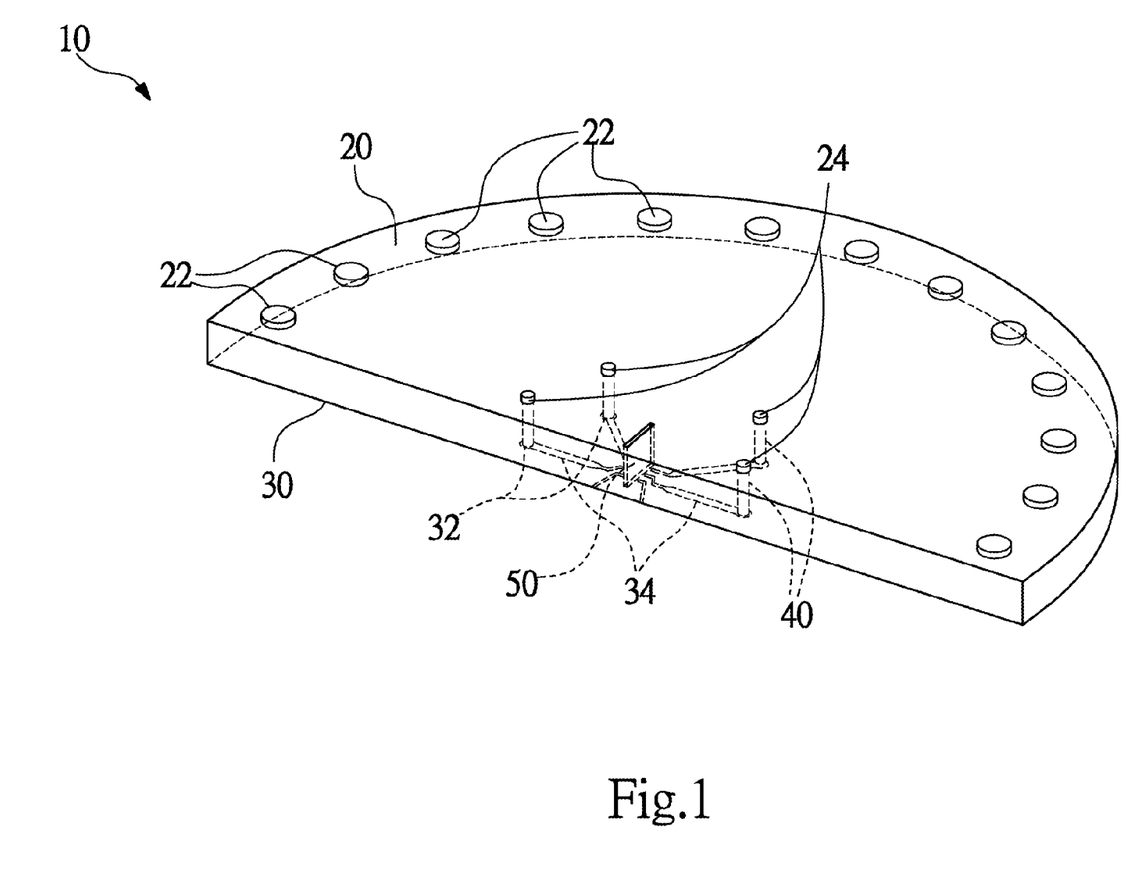
FIG. 1 is a local perspective view schematically showing a printed circuit board of a probe card according to one embodiment of the present invention.

Refer to FIG. 1 a local perspective view schematically showing a printed circuit board of a probe card according to one embodiment of the present invention. The printed circuit board 10 of the present invention comprises a first side 20, a second side 30, a plurality of plated through holes 40, and at least one electric barrier 50. The first side 20 has a plurality of first contacts 22 and a plurality of second contacts 24. At least two first contacts 22 are respectively corresponding to different second contacts 24. The second side 30 is opposite the first side 20 and has a plurality of third contacts 32 and a plurality of second-side traces 34. The third contacts 32 are respectively corresponding to the second contacts 24. Preferably, the first side 20 is a tester side of the printed circuit board 10, and the second side 30 is a wafer side of the printed circuit board 10. The plurality of plated through holes 40 penetrates through the first side 20 and the second side 30 to respectively electrically connect the third contacts 32 with the corresponding second contacts 24. The at least one electric barrier 50 is disposed in the printed circuit board 10. Preferably, the at least one electric barrier 50 is disposed among the second-side traces 34.

Figure 2A:
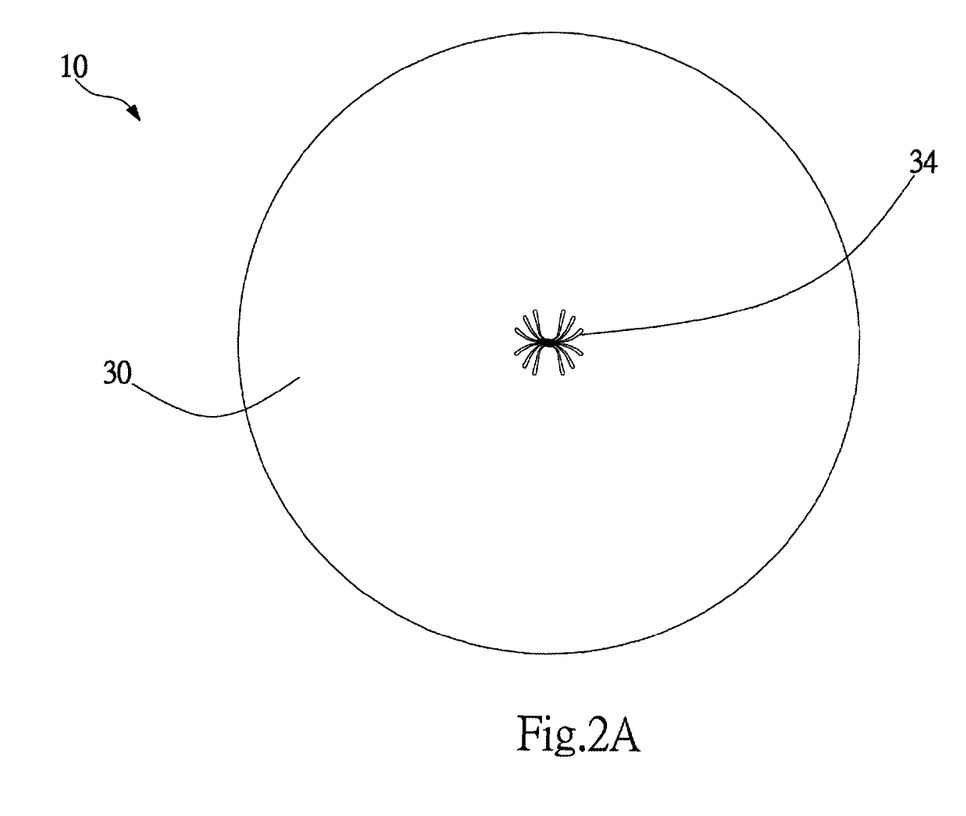
FIG. 2A is a plan view schematically showing the layout of the second-side traces on the second side of a printed circuit board of a probe card according to one embodiment of the present invention.
Figure 2B:
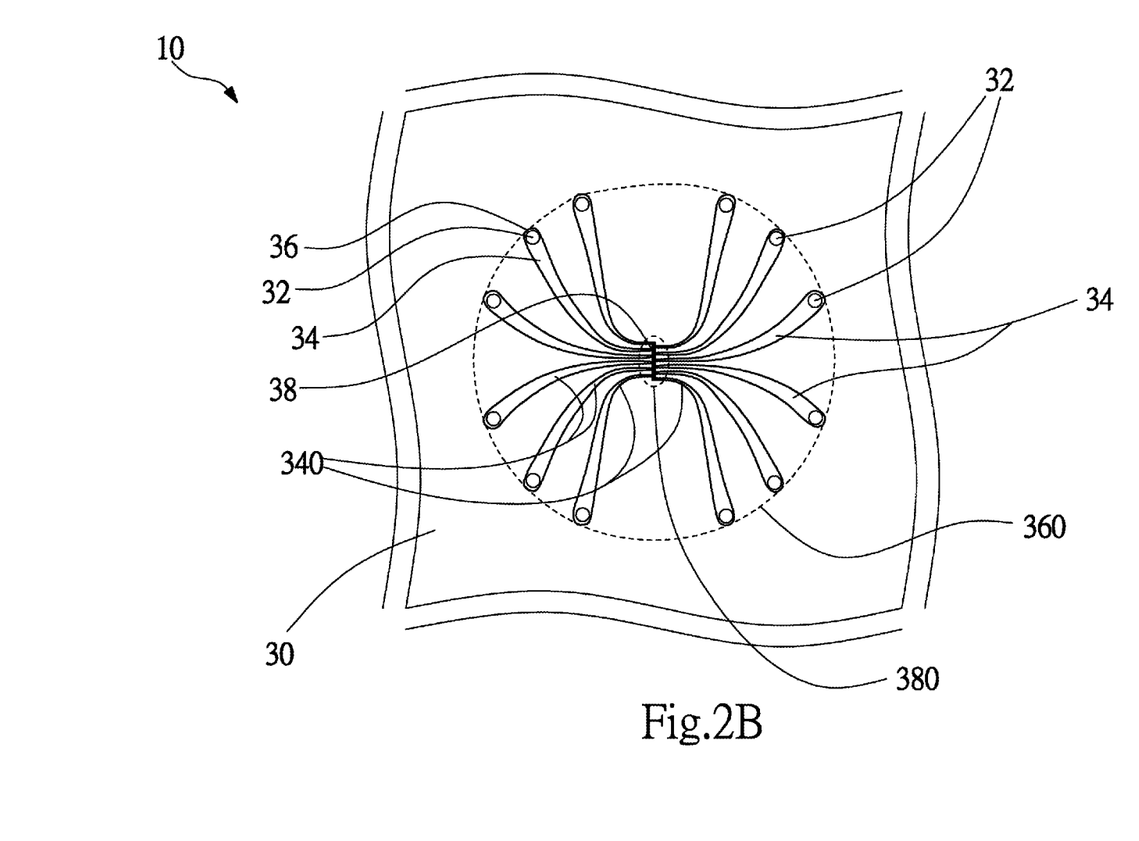
FIG. 2B is a plan view where a local region of FIG. 2A is enlarged for schematically showing third contacts and gradually-shrinking second-side traces according to one embodiment of the present invention.

Refer to FIG. 2A a plan view schematically showing that the second-side traces 34 are disposed on the second side 30 of the printed circuit board 10 according to one embodiment of the present invention. Also refer to FIG. 2B a plan view where a local region of FIG. 2A is enlarged for schematically showing the third contacts 32 and the second-side traces 34 according to one embodiment of the present invention. Each second-side trace 34 has a front end 36 and a rear end 38. The front end 36 of each second-side trace 34 is electrically connected with one of the third contacts 32. In one embodiment, the rear ends 38 of the second-side traces 34 are distributed in a predefined/specific area 380 which is located in a region 360 encircled by a loop formed via connecting the front ends 36. In other words, the second-side traces 34 are fan-in from the front ends 36 toward the rear ends 38. In one embodiment, the width of each second-side trace 24 gradually shrinks from the front end 36 thereof to the rear end 38 thereof. In one embodiment, each second-side trace 34 has at least one arc portion 340, and the arc portion 340 preferably has at least one curvature. It should be noted: the three abovementioned embodiments do not exclude each other. In other words, one second-side trace 34 may have at least one of the characteristics of fan-in, shrinking width, and at least one arc portion 340. Preferably, the second-side traces 34 are fabricated with an etching method.

Figure 2C:
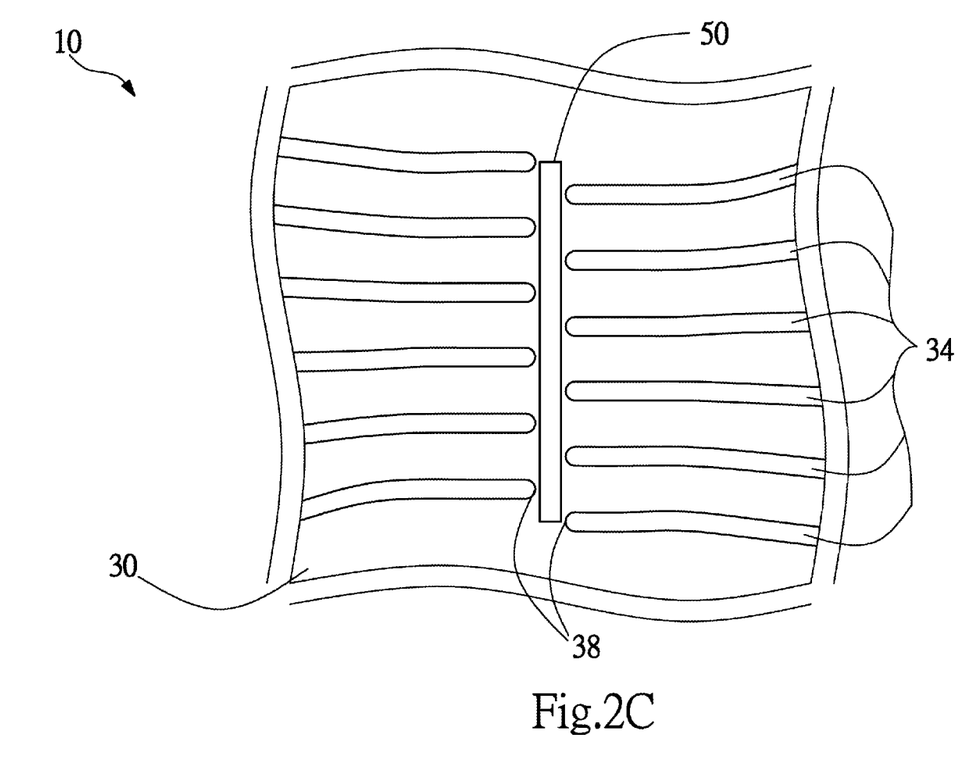
FIG. 2C is a plan view where a local region of FIG. 2B is enlarged for schematically showing rear ends of second-side traces and an electric barrier according to one embodiment of the present invention.
Figure 2D:
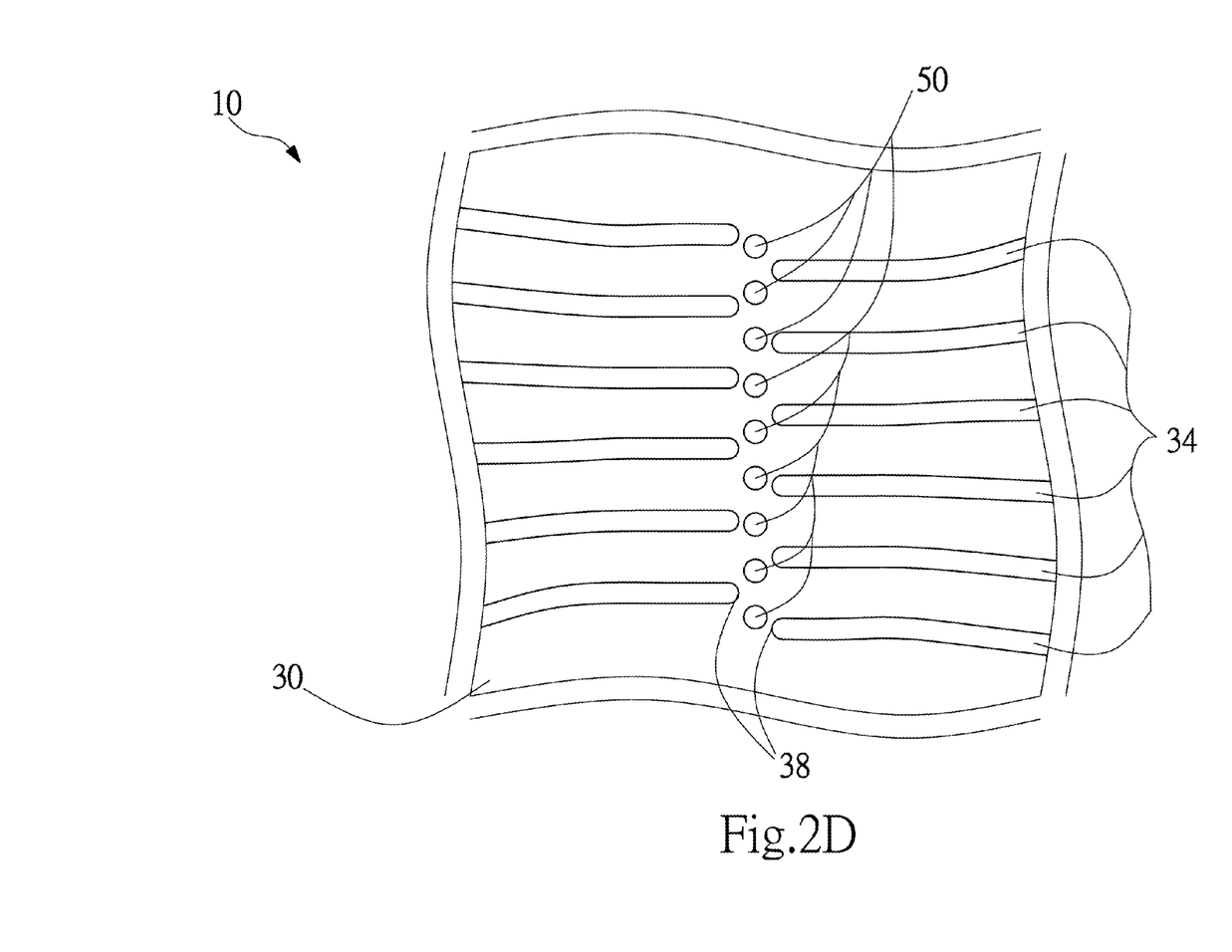
FIG. 2D is a plan view schematically showing electric barriers according to another embodiment of the present invention.
Figure 2E:
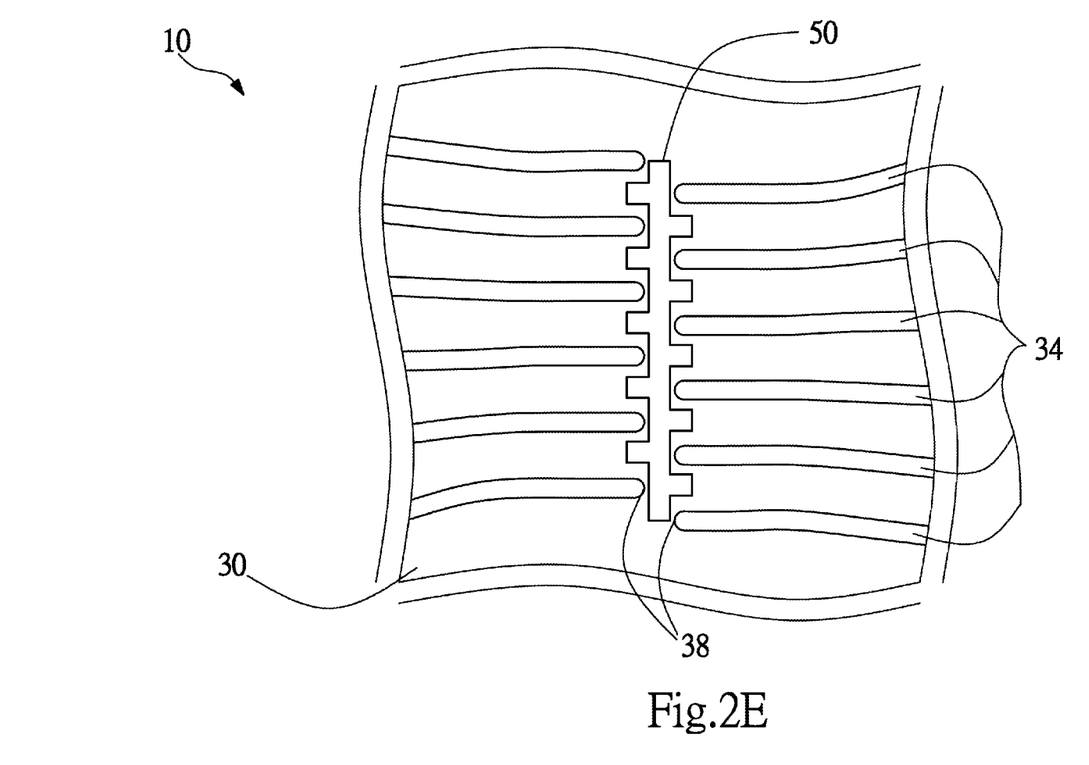
FIG. 2E is a plan view schematically showing an electric barrier according to yet another embodiment of the present invention.
Figure 2F:
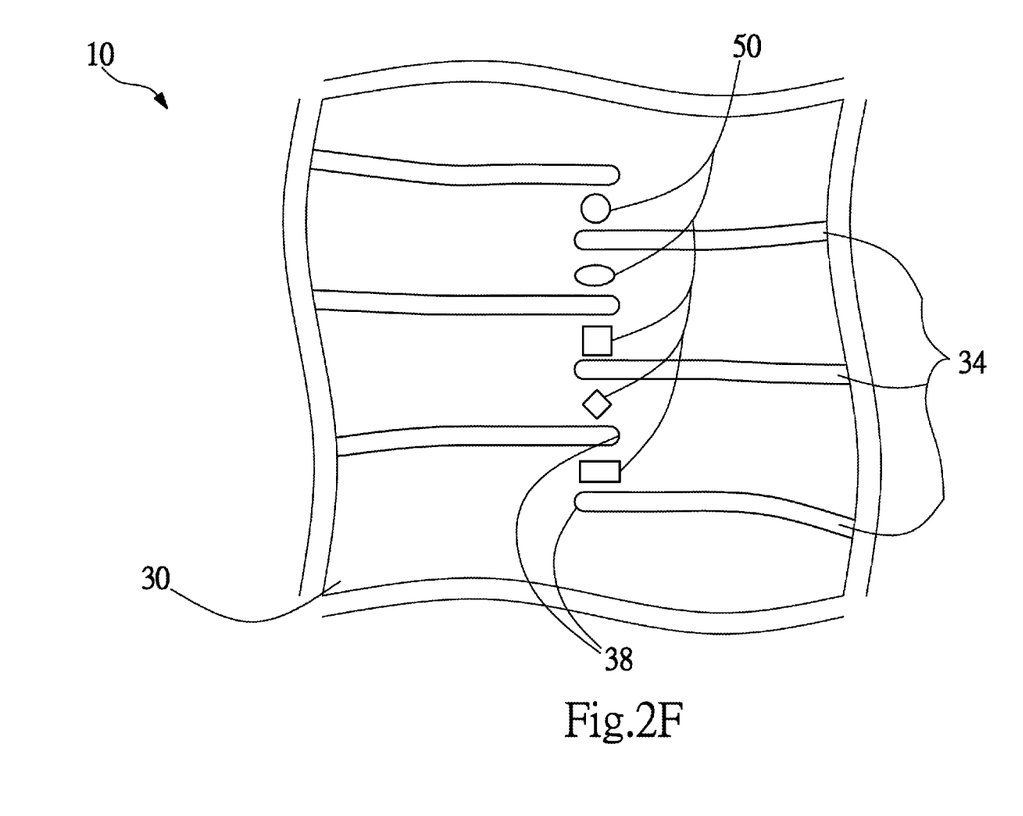
FIG. 2F is a plan view schematically showing rear ends of second-side traces and electric barriers according to further another embodiment of the present invention.

Refer to FIG. 2C a plan view where a local region of FIG. 2B is enlarged for schematically showing the rear ends 38 of the second-side traces 34 and the electric barrier 50 according to one embodiment of the present invention. The electric barrier 50 is a slot disposed among the second-side traces 34, especially among the rear ends 38 of the second-side traces 34. Refer to FIG. 2D a plan view schematically showing the second-side traces 34 and the electric barriers 50 according to another embodiment of the present invention. In the embodiment shown in FIG. 2D, the layout of the second-side traces 34 is the same as that of the embodiment shown in FIG. 2C, and the electric barriers 50 are in form of holes respectively disposed between two adjacent second-side traces 34. Refer to FIG. 2E a plan view schematically showing the second-side traces 34 and the electric barrier 50 according to yet another embodiment of the present invention. In the embodiment shown in FIG. 2E, the layout of the second-side traces 34 is the same as that of the embodiment shown in FIG. 2C, and the electric barrier 50 is a slot having a special shape, wherein the electric barrier 50 exists between each two adjacent second-side traces 34. Refer to FIG. 2F a plan view schematically showing the second-side traces 34 and the electric barriers 50 according to further another embodiment of the present invention. In the embodiment shown in FIG. 2F, the layout of the second-side traces 34 is different from that of the embodiment shown in FIG. 2C, and each two adjacent second-side traces 34 has one electric barrier 50. In the embodiment shown in FIG. 2F, each electric barrier 50 may be a slot, a hole or a structure made of an insulating material.

It should be understood: the embodiments shown in FIG. 2C-2F are only to exemplify the present invention but not to limit the scope of the present invention; the present invention does not particularly limit the shape of the electric barrier 50; the present invention arranges at least one electric barrier 50 between each two adjacent second-side traces 34; the present invention does not limit that the layout of the second-side traces 34 must be one of the layouts shown in drawings. Preferably, at least one electric barrier 50 is disposed between the rear ends 38 of at least two second-side traces 34. The electric barrier 50 has a higher insulation coefficient, such as an insulation coefficient of air or an insulation coefficient higher than that of air, so as to prevent from leakage current between two adjacent second-side traces 34. It is preferred: the electric barriers 50 are in form of at least one slot, at least one hole, or at least one structure made of an insulating material; the slot is a through slot or a blind slot; the hole is a through hole or a blind hole; the insulating material has an insulation coefficient higher than that of air.

Figure 3A:
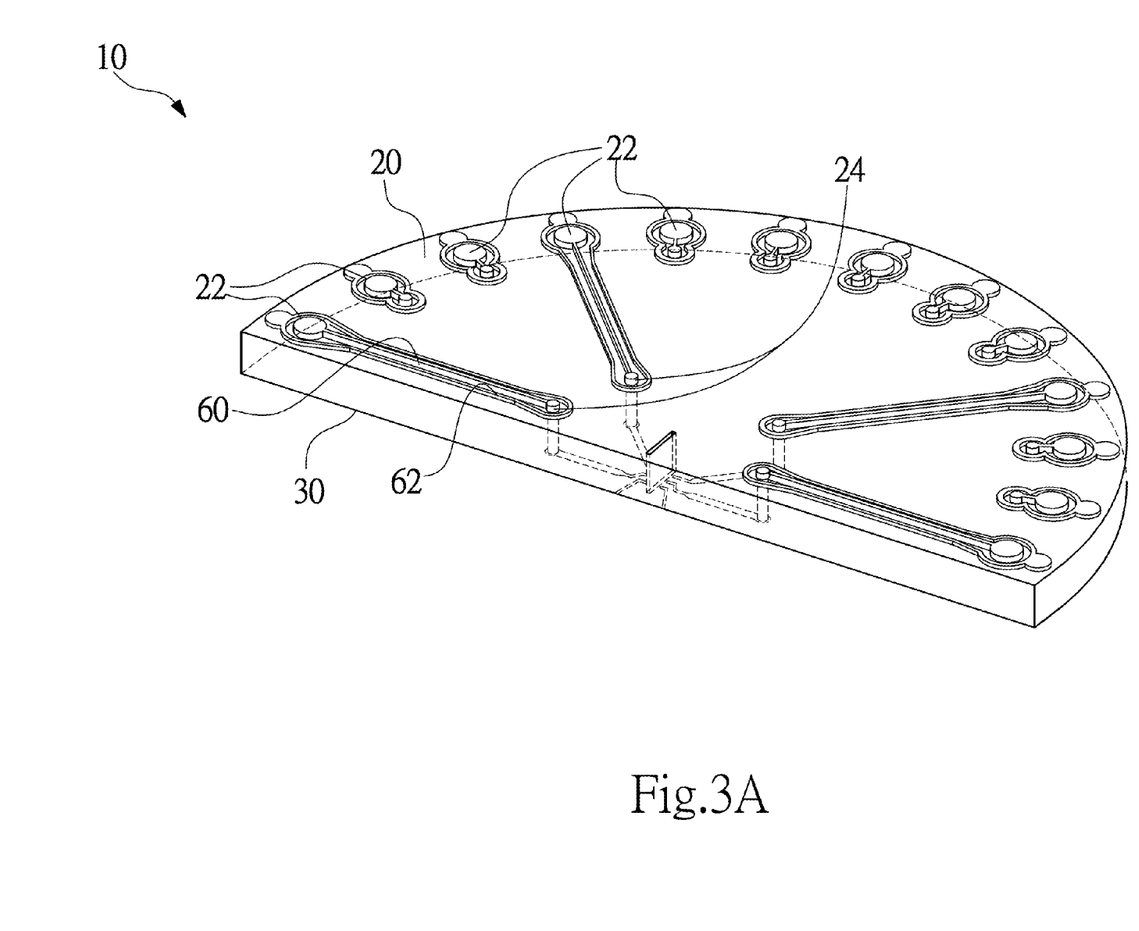
FIG. 3A is a perspective view schematically showing signal traces and ground traces on the first side of a printed circuit board according to one embodiment of the present invention.
Figure 3B:
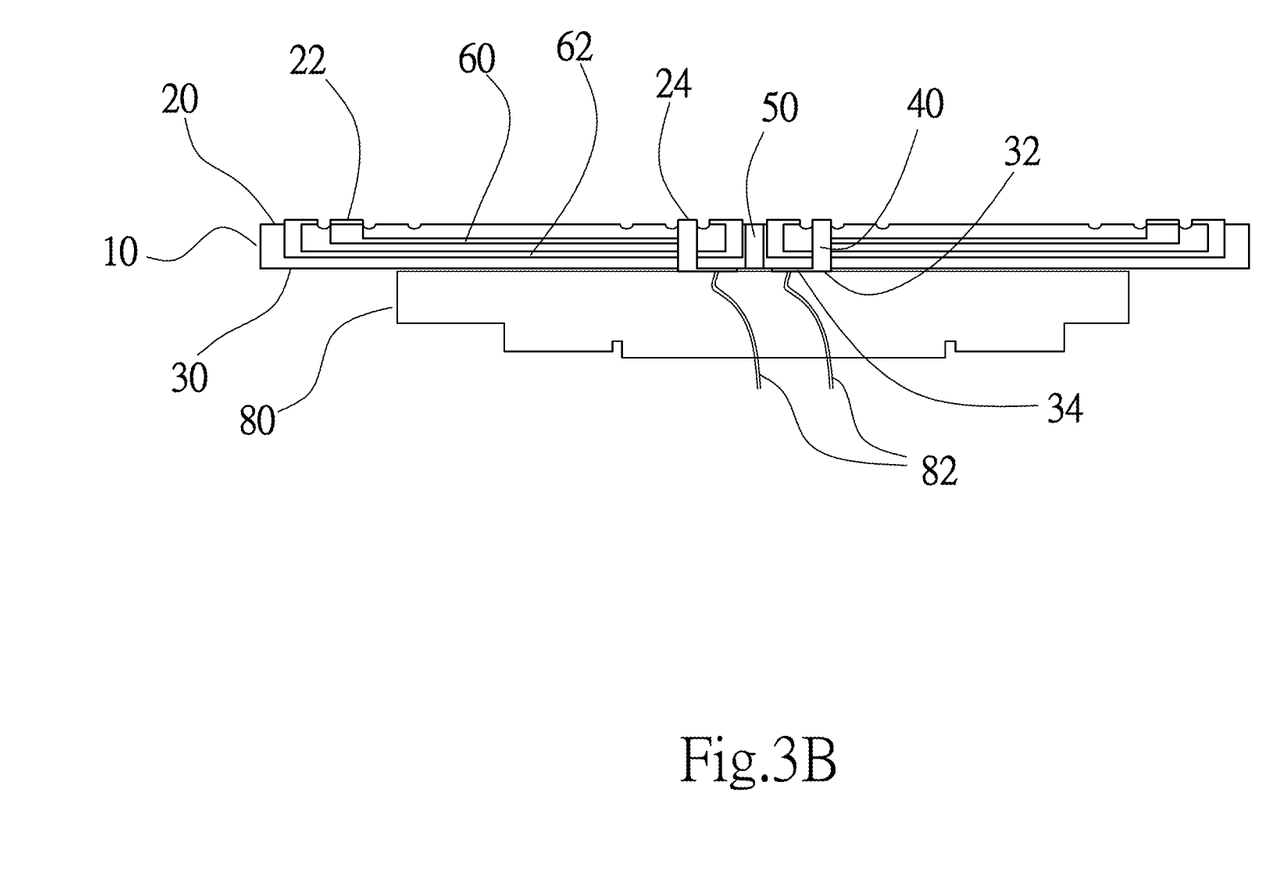
FIG. 3B is a sectional view schematically showing the printed circuit board has signal traces and ground traces and is connected with a probe head according to one embodiment of the present invention.

Refer to FIG. 3A a perspective view schematically showing signal traces 60 and ground traces 62 on the first side 20 of a printed circuit board 10 according to one embodiment of the present invention. The signal trace 60 electrically connects the first contact 22 and the second contact 24. The ground trace 62 runs along the signal trace 60, not contacting any one of the first contact 22, the second contact 24 and the signal trace 60. Refer to FIG. 3B a sectional view schematically showing the printed circuit board 10 has signal traces 60 and ground traces 62 and is connected with a probe head 80 according to one embodiment of the present invention. In the embodiment shown in FIG. 3B, the signal traces 60 and the ground traces 62 are arranged between the first side 20 and the second side 30 of the printed circuit board 10. The probe head 80 is disposed on the second side 30 of the printed circuit board 10 and has a plurality of probes 82 directly contacting the second-side traces 34.

The embodiments of FIG. 3A and FIG. 3B shows that the signal traces 60 and the ground traces 62 may be disposed on the first side 20 of the printed circuit or disposed inside the printed circuit board 10. It is preferred: there is one signal trace existing between each second contact 24 and the corresponding first contact 22.

Figure 4A:
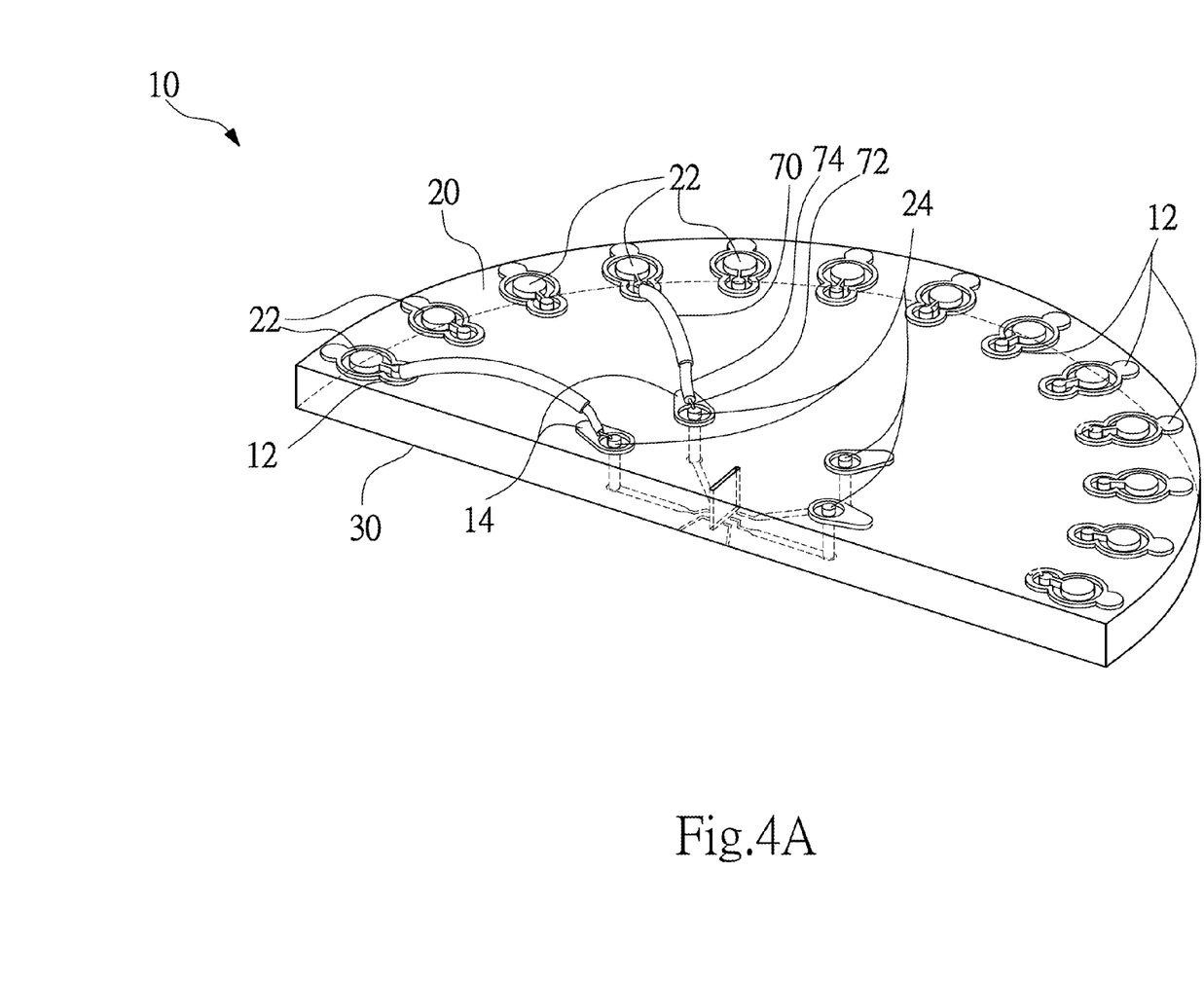
FIG. 4A is a locally-enlarged perspective view schematically showing that the first side of a printed circuit board has a plurality of coaxial cables according to one embodiment of the present invention.
Figure 4B:
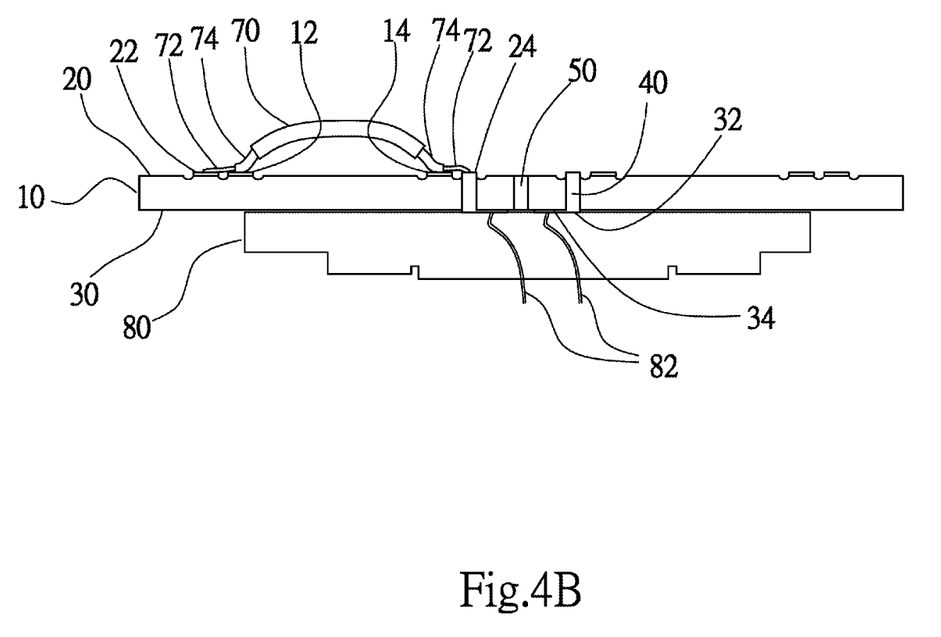
FIG. 4B is a sectional view schematically showing that a printed circuit board has a plurality of coaxial cables and is connected with a probe head according to one embodiment of the present invention.

Refer to FIG. 4A a locally-enlarged perspective view schematically showing that the first side 20 of the printed circuit board 10 has a plurality of coaxial cables 70 according to one embodiment of the present invention. In FIG. 4A, the first side 20 of the printed circuit board 10 has a plurality of first ground contacts 12 and a plurality of second ground contacts 14 each corresponding to one first ground contact 12; each coaxial cable 70 has a signal cable 72 and a ground cable 74 separated from the signal cable 72 by an insulating layer (not shown in the drawing). The signal cable 72 electrically connects one first contact 22 and the corresponding second contact 24. The ground cable 74 electrically connects one first ground contact 12 and the corresponding second ground contact 14. The first ground contact 12 is disposed beside the first contact 22; the second ground contact 14 is disposed beside the second contact 24. Refer to FIG. 4B a sectional view schematically showing that the printed circuit board 10 has a plurality of coaxial cables 70 and is connected with a probe head 80 according to one embodiment of the present invention. In the embodiment shown in FIG. 4B, the probe head 80 is disposed on the second side 30 of the printed circuit board 10 and has a plurality of probes 82 directly contacting the second-side traces 34.

What is claimed is:

1. A printed circuit board of a probe card, which is a substrate having a first side and a second side and comprises:
   a plurality of first contacts disposed on said first side of said substrate;
   a plurality of second contacts disposed on said first side of said substrate, wherein at least two of said first contacts are respectively corresponding to different ones of said second contacts and a signal trace or a signal cable is disposed between each of said second contacts and a corresponding one of said first contacts to electrically connect each other;
   a plurality of third contacts disposed on said second side of said substrate and respectively corresponding to different ones of said second contacts, wherein said first contacts and said third contacts are designed to have a fan-in layout;

a plurality of second-side traces disposed on said second side of said substrate and each having a front end and a rear end, wherein said front end of each said second-side trace is electrically connected with one of said third contacts, and wherein said rear ends of said second-side traces are distributed in a predefined area which is located in a region encircled by a loop formed via connecting said front ends of said second-side traces;

a plurality of plated through holes penetrating through said first side and said second side of said substrate to electrically connect each of said third contacts with a corresponding one of said second contacts; and at least one electric barrier disposed among at least two of said second-side traces.

2. The printed circuit board of a probe card according to claim 1, wherein said at least one electric barrier is disposed among said rear ends of at least two of said second-side traces.

3. The printed circuit board of a probe card according to claim 1, wherein a width of each of said second-side traces gradually shrinks from said front end thereof to said rear end thereof.

4. The printed circuit board of a probe card according to claim 1, wherein each of said second-side traces has at least one arc portion.

5. The printed circuit board of a probe card according to claim 1, wherein said second-side traces are fabricated with an etching method.

6. The printed circuit board of a probe card according to each of claim 1, wherein said at least one electric barrier includes at least one of slots, holes, and structures made of an insulating material, and wherein said slots are through slots or blind slots, and wherein said holes are through holes or blind holes, and wherein said insulating material has an insulation coefficient greater than that of air.

7. The printed circuit board of a probe card according to each of claim 6, further comprising a probe head having a plurality of probes, wherein said probe head directly contacts said second-side traces through said probes.

8. The printed circuit board of a probe card according to each of claim 1, further comprising a probe head having a plurality of probes, wherein said probe head directly contacts said second-side traces through said probes.

* * * * *